United States Patent
Steffan et al.

(10) Patent No.: US 6,377,898 B1
(45) Date of Patent: Apr. 23, 2002

(54) AUTOMATIC DEFECT CLASSIFICATION COMPARATOR DIE SELECTION SYSTEM

(75) Inventors: Paul J. Steffan, Elk Grove; Allen S. Yu, Fremont, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/294,246

(22) Filed: Apr. 19, 1999

(51) Int. Cl.[7] .............................................. G06F 19/00
(52) U.S. Cl. ............................ 702/82; 702/40; 702/81; 702/108; 702/183; 702/83; 702/84
(58) Field of Search ................. 702/33–36, 40, 702/81–84, 108, 117–119, 121–123, 150, 170, 172, 183–185, 187, 188, FOR 103, FOR 104, FOR 123–FOR 125, FOR 134, FOR 135, FOR 137, FOR 144, FOR 148, FOR 170, FOR 171; 700/121; 438/14, 16, 15; 716/21

(56) References Cited

U.S. PATENT DOCUMENTS

| | | | | |
|---|---|---|---|---|
| 5,761,064 A | * | 6/1998 | La et al. ................. | 364/468.17 |
| 5,841,893 A | * | 11/1998 | Ishikawa et al. ............ | 382/145 |
| 6,040,912 A | * | 3/2000 | Zika et al. .................. | 356/394 |
| 6,044,208 A | * | 3/2000 | Papadopoulou et al. ..................... | 395/500.05 |
| 6,091,846 A | * | 7/2000 | Lin et al. .................... | 382/145 |
| 6,096,093 A | * | 8/2000 | Caywood et al. ............. | 716/21 |
| 6,154,714 A | * | 11/2000 | Lepejian ..................... | 702/118 |
| 6,169,960 B1 | * | 1/2001 | Ehrichs ....................... | 702/36 |
| 6,178,257 B1 | * | 1/2001 | Alumot et al. .............. | 382/145 |
| 6,185,322 B1 | * | 2/2001 | Ishikawa et al. ........... | 382/141 |
| 6,185,324 B1 | * | 2/2001 | Ishikawa et al. ............ | 382/149 |
| 6,185,511 B1 | * | 2/2001 | Steffan et al. ............... | 702/81 |
| 6,198,982 B1 | * | 3/2001 | Park et al. ................... | 700/121 |
| 6,208,751 B1 | * | 3/2001 | Almong ..................... | 382/149 |
| 6,210,983 B1 | * | 4/2001 | Atchison et al. ............. | 438/14 |

* cited by examiner

*Primary Examiner*—Marc S. Hoff
*Assistant Examiner*—Carol S. W. Tsai
(74) *Attorney, Agent, or Firm*—H. Donald Nelson

(57) ABSTRACT

A method of analyzing and classifying defects on semiconductor wafers during a semiconductor manufacturing process using a comparator die selector system wherein an automatic defect classification review tool compares defects on a die location with an identical location on an identical die. The automatic defect classification review tool locates identical die with information from the comparator die selector system.

4 Claims, 3 Drawing Sheets

AUTOMATIC DEFECT CLASSIFICATION COMPARATOR DIE SELECTION SYSTEM

BACKGROUND OF THE INVENTION

1. Field of the Invention

This invention relates generally to the manufacture of high performance semiconductor devices. More specifically, this invention relates to the manufacture and the detection and classification of defects during the manufacture of high performance semiconductor devices. Even more specifically, this invention relates to the manufacture and the detection and classification of defects during the manufacture of high performance semiconductor devices utilizing an ADC Comparator Die Selection System.

2. Discussion of the Related Art

In order to remain competitive, a semiconductor manufacturer must continuously increase the performance of the semiconductor integrated circuits being manufactured and at the same time, reduce the cost of the semiconductor integrated circuits being manufactured. Part of the increase in performance and in the reduction in cost of the semiconductor integrated circuits being manufactured is accomplished by shrinking the semiconductor device dimensions and by increasing the number of circuits per unit area on an integrated circuit chip. Another part of reducing the cost of a semiconductor chip is to increase the manufacturing yield. As is known in the semiconductor manufacturing art, the yield of chips (also known as die) from each wafer is not 100% because of defects during the manufacturing process. The number of good chips obtained from a wafer determines the yield and, as can be appreciated, chips that are discarded because of a defect or defects increases the cost of the remaining usable chips because the cost of manufacturing is amortized over the remaining usable chips.

A single semiconductor chip requires numerous processing steps during its manufacture. These steps include processing steps such as deposition of materials, implantation of ions, oxidation, etching, metallization and wet chemical cleaning. Typically, these processing steps involve placing the wafer on which the semiconductor chips are being manufactured into different tools during each of the processing steps. The optimization of each of these processing steps requires an understanding of a variety of chemical reactions and physical processes in order to produce high performance, high yield circuits. The ability to view and characterize the surface and interface layers of semiconductor chips in terms of their morphology, chemical composition and distribution is an invaluable aid to those involved in research and development, process, problem solving, and failure analysis of the resulting integrated circuits. A major part of the analysis process is to capture (detect) defects, properly classify the defects, and to analyze the defects completely to determine what caused the defects and to eliminate or avoid the cause of the defects.

In order to be able to quickly resolve process or equipment issues in the manufacture of semiconductor products, a great deal of time, effort and money is being expended by semiconductor manufacturers to capture and classify silicon based defects. Once a defect is caught and properly described and classified, work can begin to resolve the cause of the defect and to eliminate or avoid the cause of the defect. One of the biggest problems that faced semiconductor manufacturers was the inability of human inspectors to uniformly classify defects consistently and without error. This problem was solved by the development of Automatic Defect Classification (ADC) systems.

One ADC system for automatically classifying defects includes the following methodological sequence. View an image of a defect in an ADC Review Tool and assign values to elemental descriptor terms called predicates that are general descriptors such as roundness, brightness, color, hue, graininess, etc. Assign a classification code to the defect based upon the values of all the predicates. A typical ADC system can have 40 or more quantifiable qualities and properties that are considered predicates. Each predicate can have a specified range of values and a typical predicate can have a value assigned to it between 1 and 256. A value of 1 indicates that none of the value is present and a value of 256 indicates that the quality represented by the predicate is ideal. For example, a straight line would have a value of 1 for the predicate indicating roundness, whereas a perfect circle would have a value of 256 for the same predicate.

A great enabler in the field of defect capture and analysis and the use of ADC systems has been the creation of Defect Management Systems (DMS). These DMS systems relationally associate defects with product/layer/wafer locations allowing the recapture of these defects on various analytical tools, as well as yield or trend analysis with other process related events. Increasingly, analysis tools, such as FIB (fixed ion beam) and SEM/EDS (scanning electron microscopes/energy dispersive spectroscopy) tools have been used in the manufacturing environment and images generated by these tools are routinely appended to these defects as image files. This has enhanced the ability of yield or process experts to quickly view images and/or spectra that would normally be kept in a folder that is retrievable manually.

The ADC system determines the classification code for each defect from the combination of all the predicate values assigned to the defect. The goal of an ADC system is to be able to uniquely describe all the defect types in such a manner that a single classification code can be assigned to a defect which is differentiated from all other defect types. This is accomplished by a system administrator who programs an artificial intelligence system to recognize various combinations and permutations of the 40 or more predicates to assign the same classification code to the same type of defect. This would result in a highly significant statistical confidence in the probability that the defect and all other defects of the same type or class will always be assigned the same classification code by the ADC system. These predicate values from the ADC system are stored in a database by the DMS. In order to make the data generated by the ADC system statistically valid, randomness must be maintained in the defect-for-ADC selection process. To accomplish the randomness, a system has been established that pre-selects defects for classification based on data from the current scan and previous scans. All previously caught defects and "cluster" defects are removed from the target population and "n" defects are randomly selected from that group. These defect locations are then sent to the ADC review tool by the DMS. The ADC review tool uses die-to-die comparative techniques to determine whether a defect exists and to determine the defect type by looking at the current defect location and the exact same location on the adjacent die for comparison purposes. As can be appreciated, this methodology works well under circumstances when every die on a wafer being analyzed are identical such as the wafer shown in FIG. 1. However, if the wafer has an alternating pattern such as, a stripe set (a row or column with a different device), drop-in patterns (test chips), or alignment marks, the ADC system fails by providing erroneous results.

Therefore, what is needed is a system that provides the ADC review tool with information so that the ADC review tool knows where valid die are located so that a valid comparison can be made in the ADC process.

SUMMARY OF THE INVENTION

According to the present invention, the foregoing and other objects and advantages are attained by using a comparator die selector system.

In accordance with an aspect of the invention, a semiconductor wafer production lot is sent through a manufacturing process, a first layer of the wafer lot is processed, a selected inspection wafer is placed in a scan tool, defect location information and die information are sent to a defect management system, which sends the defect location information and die information to a comparator die selector system, and an automatic defect classification review tool analyzes and classifies defects using the information from the comparator die selector system.

In accordance with another aspect of the invention, the automatic defect classification review tool analyzes and classifies defects by comparing a defect location on the die on which the defect is located with an identical location on an identical die.

In accordance with another aspect of the invention, the identical die is immediately adjacent to the defective die.

In accordance with still another aspect of the invention, the identical die is remote from the defective die. The remote identical die is located by information from the comparator die selector system.

The described method thus effective provides a method to analyze and classify defects on semiconductor wafers that have identical die or on semiconductor wafers that have more than one type of die.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1:
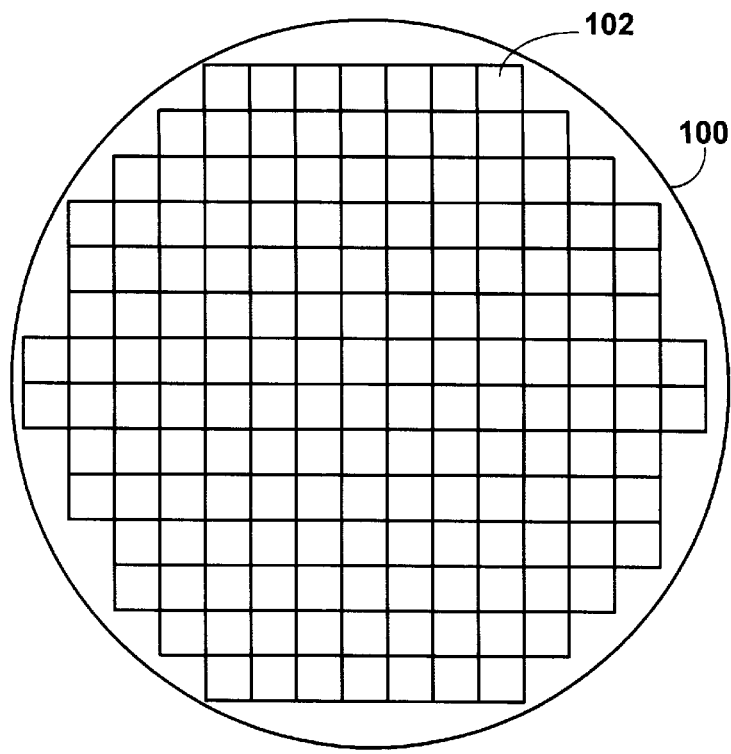
FIG. 1 shows identical die manufactured on a semiconductor wafer.

FIG. 1 shows a semiconductor wafer 100 with identical semiconductor die, represented by die 102 manufactured on the semiconductor wafer 100.

Figure 2:
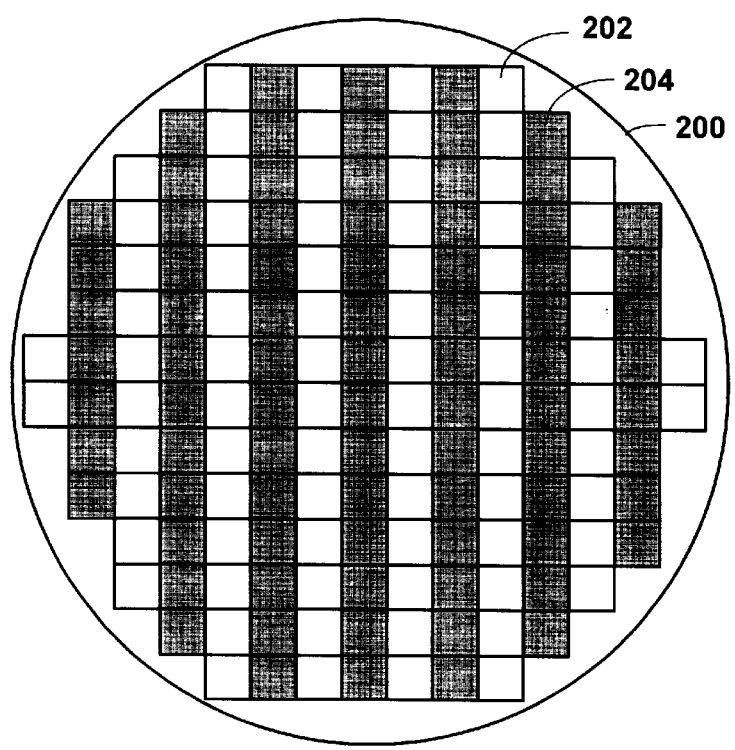
FIG. 2 shows the same number of die as shown in FIG. 1 manufactured on a semiconductor wafer, however, the die are not identical.

FIG. 2 shows a semiconductor wafer 200 with die of a first type, represented by die 202 manufactured on the semiconductor wafer 200 and with die of a second type, shown shaded and represented by die 204 manufactured on the semiconductor wafer 200. It should be appreciated that other patterns of alternating types of die are comprehended by this application including, but not limited to different die in rows rather than columns, drop-in patterns, such as test chips, and various alignment marks located at different locations on the wafer.

Figure 3:
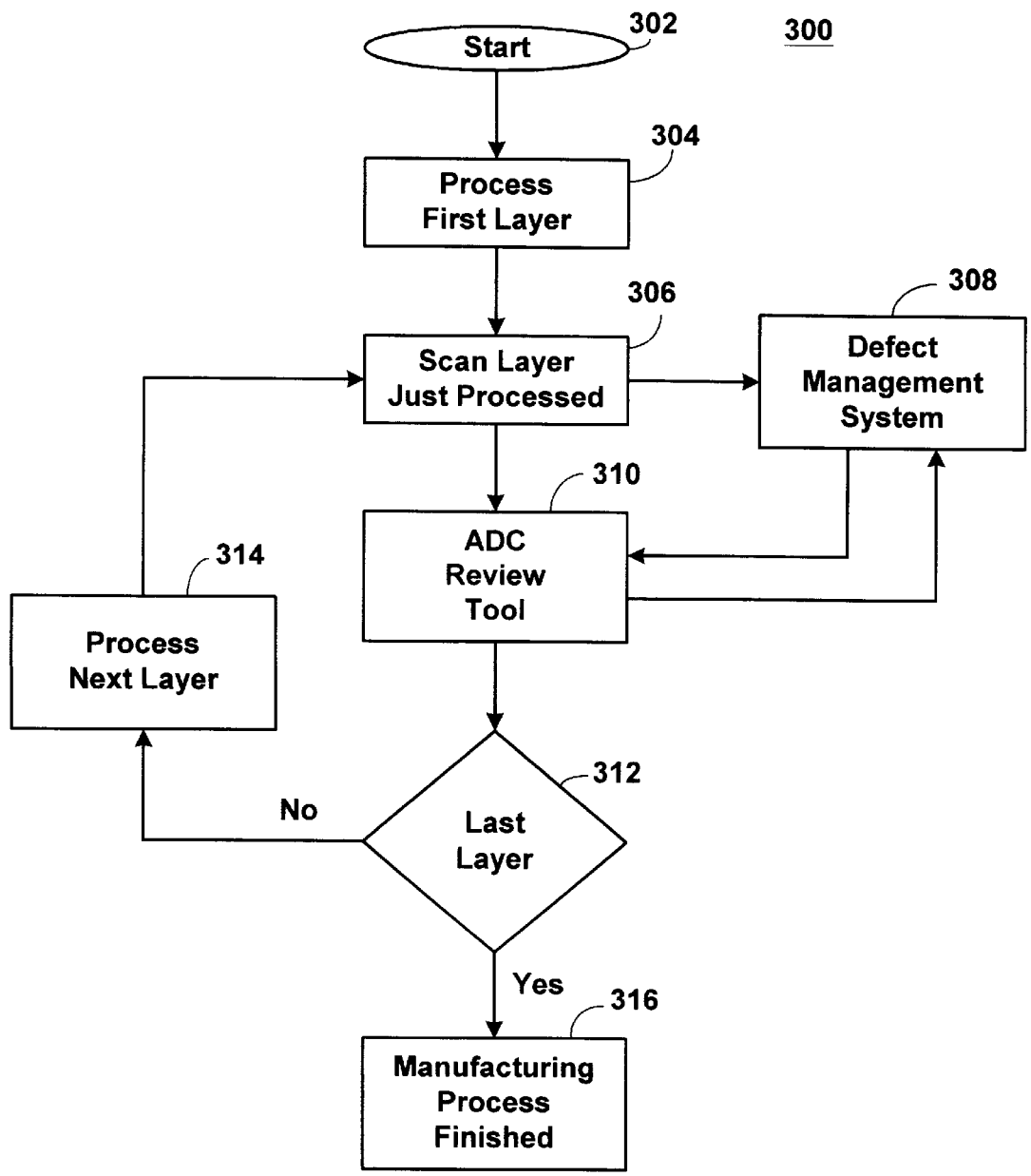
FIG. 3 is a portion of a flow diagram of a typical semiconductor manufacturing process showing the use of an ADC review tool to automatically classify defects located by a scan tool and a defect management system (DMS) that stores defect information in a database.

FIG. 3 is a portion 300 of a flow diagram of a typical semiconductor manufacturing process showing the use of an automatic defect classification (ADC) review tool to automatically classify defects located by a scan tool and a defect management system (DMS) that stores defect information in a database. The defect information generated by the scan tool is stored in the database and can be sent to various review tools for review of selected defects or review of all defects. The defect information generated by the various review tools is also sent to the defect management system and is stored in the database and is available to operators to review and analyze. A production lot of wafers is processed at one time. A production lot of wafers typically consists of approximately 25 wafers. The manufacturing process typically involves the processing of multiple layers, however the processing of only one layer will be described herein. The portion 300 of the manufacturing process begins with a first layer, indicated at 302 and the first layer is processed at 304. After the layer is processed, a selected wafer from the production lot is placed in a scan tool at 306, which scans the selected wafer and captures defects by determining their locations. The defect location information is forwarded to a defect management system (DMS) at 308. To analyze and classify the defects, the selected wafer is placed in an automatic defect classification (ADC) review tool at 310 and the defect management system 308 sends location information for defects that are to be analyzed and classified to the ADC review tool. The ADC review tool at 310 analyzes the defects by comparing the location of the defects in the die on which they occur to the same exact locations on adjacent die that the ADC review tool assumes are identical die. Using this information, the ADC review tool at 310 assigns a classification code to die defects. The classification codes returned to the defect management system 308, which stores the classification codes assigned to the defects in a database. As can be appreciated, success of the ADC system is dependent upon having adjacent die that are identical (with the exception of the defects) to the die on which the defects occur. If the die are different, erroneous results occur.

After the ADC review tool 310 is finished analyzing and classifying the defects, it is determined at 312 whether the layer just processed is the last layer. If the layer just processed is not the last layer, the next layer is processed at 314 and the wafer is then returned to the flow at 306 and the process described above is repeated for the next layer. If it is determined at 312 that the layer just processed is the last layer, the wafer is finished as indicated at 316.

Figure 4:
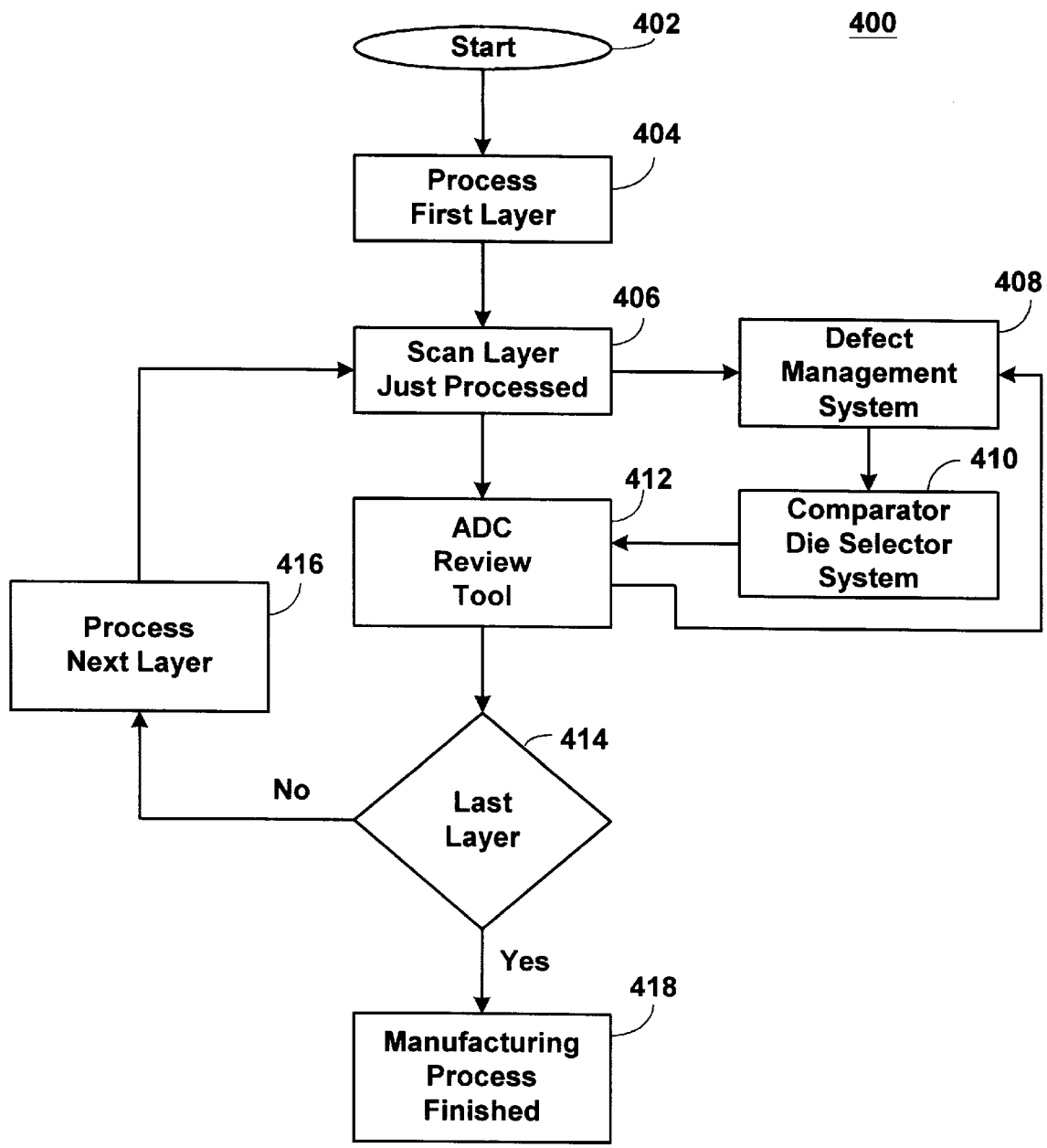
FIG. 4 is a portion of a flow diagram of a semiconductor manufacturing process in accordance with the present invention showing the use of input from a Comparator Die Selector System to an ADC review tool to automatically classify defects located by a scan tool and a defect management system (DMS) that stores defect information in a database.

FIG. 4 is a portion 400 of a flow diagram of a semiconductor manufacturing process in accordance with the present invention showing the use of input from a Comparator Die Selector System to an ADC review tool to automatically classify defects located by a scan tool and a defect management system (DMS) that stores defect information in a database. The defect information generated by the scan tool is stored in the database and can be sent to various review tools for review of selected defects or review of all defects. The defect information generated by the various review tools is also sent to the defect management system and is stored in the database and is available to operators to review and analyze. A production lot of wafers is processed at one time. A production lot of wafers typically consists of approximately 25 wafers. The manufacturing process typically involves the processing of multiple layers, however the processing of only one layer will be described herein. The portion 400 of the manufacturing process begins with a first layer, indicated at 402 and the first layer is processed at 404. After the layer is processed, a selected wafer from the production lot is placed in a scan tool at 406, which scans the selected wafer and captures defects by determining their locations. The defect location information is forwarded to a defect management system (DMS) at 408. The defect management system sends the defect location information to a comparator die selector system at 410. The comparator die selector system obtains a file from the scan tool containing information concerning which die the scan tool has scanned and which die are valid comparison die. This information is forwarded to an automatic defect classification review tool 412, which analyses and classifies defects. Because the ADC review tool at 412 knows which die are valid for comparison purposes, wafers having more than one type of semiconductor product can be correctly analyzed and classified. In addition, wafers having more than one type of semiconductor product plus drop-in patterns, and alignment marks can be correctly analyzed and classified.

After the ADC review tool 412 is finished analyzing and classifying the defects, it is determined at 414 whether the layer just processed is the last layer. If the layer just processed is not the last layer, the next layer is processed at 416 and the wafer is then returned to the flow at 406 and the process described above is repeated for the next layer. If it is determined at 414 that the layer just processed is the last layer, the wafer is finished as indicated at 418.

Some of the benefits of the invention include:
1. The ability to do ADC on stripe mask sets, with test chip drop-ins and wafers having alignment marks.
2. Provides the opportunity for an operator at the review tool to view actual scanned die.

In summary, the results and advantages of the method of analyzing and classifying defects on a semiconductor wafer using a comparator die selector system. The described method thus effective provides a method to analyze and classify defects on semiconductor wafers that have identical die or on semiconductor wafers that have more than one type of die.

The foregoing description of the embodiments of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of analyzing and classifying defects on a semiconductor wafer on which at least two different types of die are manufactured during a semiconductor manufacturing process, the method comprising:

sending a production lot of wafers through a manufacturing process;

scanning a selected wafer from the production lot of wafers for defects;

sending location information for defects caught during the step of scanning to a defect management system;

sending die information for the at least two different types of die from the scanning tool to the defect management system:

sending the location information for defects and the die information from the defect management system to a comparator die selector system wherein the automatic defect classification review tool analyzes and classifies defects by comparing a defect location on the die on which the defect is located with an identical location on an identical die located on the semiconductor wafer being inspected; and sending the location information for defects and the die information from the comparator die selector system to an automatic defect classification review tool wherein the automatic defect classification review tool analyzes and classifies defects contained in the location information for defects and the die information from the comparator die selector system.

2. The method of claim 1 wherein the identical die is immediately adjacent to the defective die.

3. The method of claim 1 wherein the identical die is remote from the defective die.

4. The method of claim 3 wherein the remote identical die is located by the information from the comparator die selector system.

* * * * *